United States Patent [19]

Martin

[11] 4,039,969
[45] Aug. 2, 1977

[54] QUARTZ THERMOMETER

[75] Inventor: Jean-Claude Martin, Neuchatel, Switzerland

[73] Assignee: Centre Electronique Horloger S.A., Neuchatel, Switzerland

[21] Appl. No.: 646,048

[22] Filed: Jan. 2, 1976

[30] Foreign Application Priority Data

Jan. 9, 1975  Switzerland .................... 211/75

[51] Int. Cl.² ............... H03B 25/00; H03B 5/32
[52] U.S. Cl. ......................... 331/40; 73/362 R;
310/361; 310/366; 331/66
[58] Field of Search ............ 331/40, 41, 66, 116 R, 331/163; 310/8.1, 9.8; 73/362 R, 339 R, 339 A, 362 SC, 362 CP, 342

[56] References Cited
U.S. PATENT DOCUMENTS 1,850,580  3/1932  Coram .................. 331/66
2,456,811  12/1948  Blackburn ................ 331/66
3,617,923  11/1971  Paradysz ................. 331/163

*Primary Examiner*—John Kominski
*Attorney, Agent, or Firm*—Cushman, Darby & Cushman

[57] ABSTRACT

A quartz crystal thermometer in which a standard frequency is generated by a first oscillator circuit incorporating a quartz crystal element and in which a frequency which varies with temperature is generated by a second circuit incorporating the same quartz crystal element. Two electrode pairs are provided on the single quartz crystal element in order to excite two different modes of vibration of the quartz crystal element, with the metallization being on only one or on both of the major faces of the quartz crystal element. In accordance with preferred embodiments, an AT- or a BT-cut quartz crystal plate is utilized. The ratio of the said two frequencies provides an accurate measure of the temperature.

8 Claims, 7 Drawing Figures

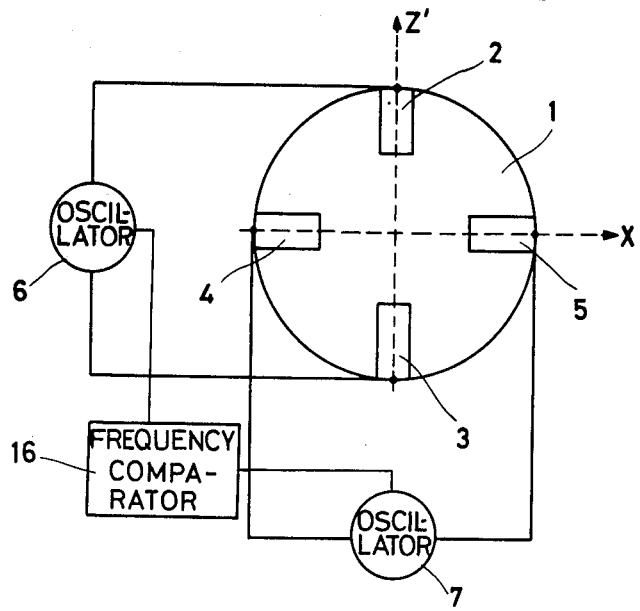
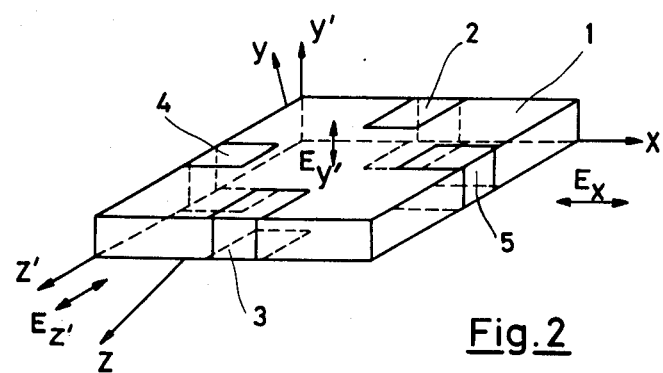
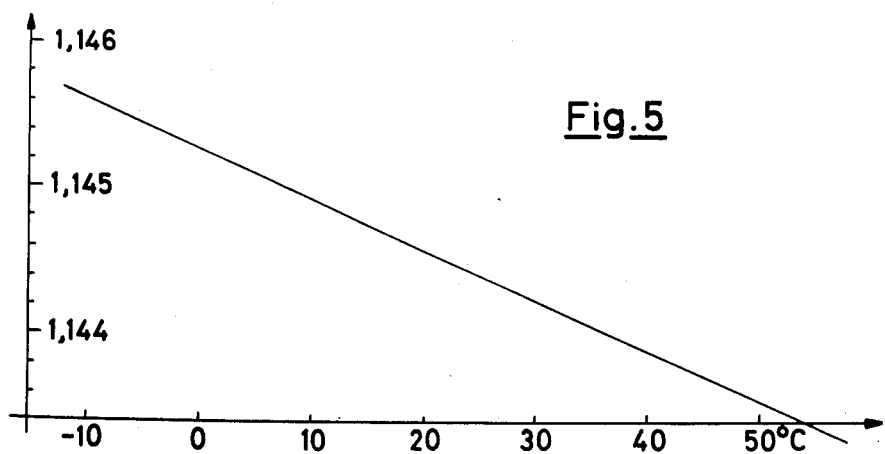

QUARTZ THERMOMETER

BACKGROUND OF THE INVENTION

The present invention relates to a quartz crystal thermometer of the type wherein a first stable or standard frequency is generated which has a small temperature coefficient, and wherein a second frequency is generated which varies with temperature, for the purpose of being compared to the standard frequency and furnishing a temperature indication.

Quartz thermometers are known wherein two separate quartz elements are provided, one quartz element having a small temperature coefficient or being placed in a nonvariable thermal environment for the purpose of generating a standard frequency, and the other quartz element having a linear temperature coefficient and providing a frequency which varies in accordance with the temperature. One such arrangement is described, for example, in an article entitled "Quartz Crystal Thermometer", by W.H. Wade et al appearing in "The Review of Scientific Instruments", Volume 33, No. 2, February 1962, pages 212 and 213. Another such arrangement is described in the article "Quartz Crystal Thermometer for Measuring Temperature Deviations in the $10^{-3}$ to $10^{-6}$°C Range" by W.L. Smith et al appearing in "The Review of Scientific Instruments", Volume 34, No. 3, Mar. 1963 at pages 268 et seq.

In such known arrangements the necessity of using two quartz elements gives them an awkard bulk and results in a high cost. The cost is increased by the fact that the quartz elements used in thermometer arrangements have to have a special cut, which makes them expensive, and the frequency of the two quartz elements must be separately adjusted.

Another disadvantage of these two quartz element thermometers lies in the fact that if the standard quartz element is adjacent the variable quartz element the probe in which they are located has a large thermal inertia and a large volume. Moreover, any difference or deviation of temperature between the two quartz elements distorts the measurement. If, on the other hand, the standard quartz element is exterior to the point where the temperature is to be measured, the influences or disturbing effects are different on the two quartz elements, and the temperature measurement could be erroneous. In that case, a thermal stabilization of the standard quartz element can become necessary, as by placing it in a non-varying thermal enviroment. Moreover, in using two quartz elements the aging properties of the elements are not the same, with independently changing frequency characteristics, the resulting errors being cumulative.

OBJECTS AND SUMMARY OF THE INVENTION

Accordingly, it is an object of this invention to obviate these various disadvantages by constructing a quartz thermometer from a single quartz crystal element, which simultaneously oscillates at the standard frequency and the temperature-variable frequency.

Briefly, in accordance with one embodiment of the invention, a single quartz element is provided comprising a circular or square plate, with metallized electrodes being formed on one or both of the major faces of the quartz crystal plate. A total of four electrodes are provided.

The single element quartz thermometer thus constructed in accordance with the invention is less bulky and more precise than a two quartz element thermometer. Further, it requires neither a thermally stable environment nor a special angle of cut of the quartz crystal plate and it is simpler and less expensive than the two quartz element thermometers.

BRIEF DESCRIPTION OF THE DRAWINGS

The present invention will be better understood by reference to the following detailed description of some preferred embodiments thereof, considered in conjunction with the drawings, in which:

FIG. 1 is a schematic view of a quartz crystal thermometer comprising a circular quartz crystal plate metallized on only one of its major faces;

FIG. 2 is a perspective view of a quartz crystal plate of rectangular form which is metallized on both of its major faces;

FIG. 5 is a graph illustrating the relationship between the temperature and the ratio temperature-dependent frequency to standard frequency for a quartz thermometer in accordance with the invention using a quartz crystal element as shown in FIG. 1.

DETAILED DESCRIPTION

Figure 3A:
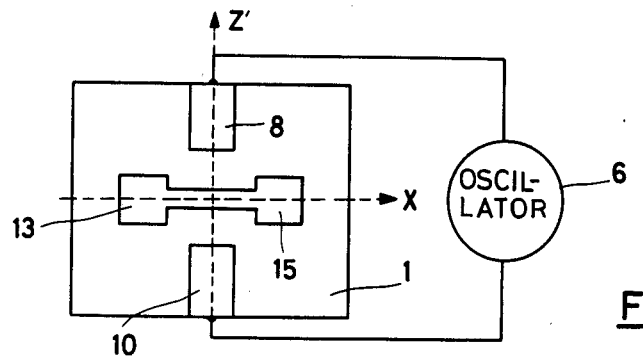
FIGS. 3A and 3B, respectively, are views from above and from underneath of another embodiment of a quartz crystal plate metallized on both of its large faces, as used in a quartz thermometer in accordance with the invention.

In the illustration of the basic arrangement of a quartz thermometer in accordance with the invention as shown in FIG. 1, a quartz crystal plate 1 is provided with four electrodes 2, 3, 4 and 5 arranged symmetrically along the edge of the plate. Electrodes 2 and 3 are electrically connected to the first oscillator circuit 6 (of a suitable type known to those skilled in this art) which is controlled by the quartz element to supply a standard frequency. Electrodes 4 and 5 are electrically connected to a second oscillator circuit 7 (of a suitable type known to those skilled in this art) which is driven by the quartz to supply a thermometer or temperature-variable frequency.

For measuring temperature, the standard frequency supplied by the oscillator circuit 6 is used as a time basis in a suitable counter arrangement 16 constituting a comparison device for determining the thermometer or temperature-varying frequency supplied by the oscillator circuit 7. A counter arrangement of the kind used in the present invention is described for instance in the article "The Crystal Resonator-a digital Transducer" by D.L. Hammond et al, appearing in the review "IEEE Spectrum", Apr. 1969, pages 53 to 58. The counter supplies the ratio of the two said frequencies which is a measure of the temperature.

The quartz plate 1 shown in FIG. 1 has a circular form and is metallized on one of its large faces. FIG. 2 illustrates another embodiment of a quartz element used in the invention in which a quartz plate 1 is a rectangular or square plate, metallized on its two major faces. In that instance, four electrodes 2',3',4' and 5' are symmetrically arranged along the edges of plate 1 and each electrode is formed by a metallization extending from the upper face to the lower face via one lateral side of the plate. This arrangement assures a better electromechanical coupling than that obtained with the arrangment of electrodes shown in FIG. 1.

According to a preferred embodiment, the quartz 1 is an AT- or BT cut plate with main directions X, Y' and Z', the directions Y' and Z' being obtained by the rotation of the mechanical axis Y and the optic axis Z of the quartz crystal, through a predetermined angle $\theta$ about the electric axis X. For an AT-cut plate, $\theta$ is equal to 35°15'. For a BT-cut plate, $\theta$ is equal to $-49°$. These data can be found in many prior art publications, such as for example, in "Quartz Vibrators and Their Applications" by Pierre Vigoureux et al, published by H.M. Stationery Office, London, 1950. In the same way as shown in FIG. 1, the electrodes 2' and 3' are connected to the first oscillator circuit 6, while the electrodes 4' and 5' are connected to the second oscillator circuit 7.

The two electrodes 2,3 of FIG. 1 or 2',3' of FIG. 2 are aligned in the direction Z' of the crystal plate 1, and create a main field $E_z$ in the direction Z', when a potential is applied between those two electrodes. The two electrodes 4,5 of FIG. 1 or 4',5' of FIG. 2 are aligned in the direction X of the crystal plate 1 and create a main field $E_x$ in the direction X when a potential is applied between those electrodes.

The two vibration modes of quartz crystal 1 are two thickness-shear modes of the plate, noted Y'X and Y'Z. Those vibration modes are described in prior art publications such as in the article. "Parallel Field Excitation of Thickness Modes of Quartz Plates" by R. Bechmann, in "Proceedings of 14th Annular Symp. On Frequency Control" (1960), p. 68. Since the two different frequencies depend mainly from the same physical parameter, the thickness of the crystal plate, their ratio is nearly independent of any geometric dimension.

The arrangement of the electrodes permits simultaneously applying two perpendicular electric fields $E_z$ and $E_x$. The simultaneous presence of the two pairs of electrodes (2, 3 and 4, 5) produces only a slight disturbance of the electric fields. In fact, the field $E_z$ which induces the standard frequency, does not excite the mode Y'X and, in a similar manner, the field $E_x$ which induces the thermometer or temperature-variable frequency, does not excite the mode Y'Z'. Moreover, those two modes Y'X and Y'Z' which both correspond to thickness-shear vibrations, are not mechanically coupled.

Provided the amplitudes of oscillation are not too large, interference-free superposition of mechanical waves is possible, so that simultaneous generation of two independent vibration modes in the same volume of quartz at two different frequencies takes place.

The element 1 has the same behavior as two different quartz elements separated from each other but having strictly the same temperature, and thus it can advantageously replace the two quartz elements currently used in quartz thermometers.

As an example, quartz 1 can be formed by an AT-cut plate of $2\times10^{-4}$m thickness, mounted with four electrodes connected to two oscillator circuits. It permits the generation of two frequencies, one at $8.3\times10^{-6}$Hz, the temperature coefficient of which is of $\pm0.1\times10^{-6}/°$C and the other at $9.5\times10^{-6}$Hz, the temperature coefficient of which is of $-30\times10^{-6}/°$C, respectively corresponding to the standard frequency and to the thermometer or temperature-variable frequency.

FIG. 5 is a graphic illustration of the ratio of the thermometer or temperature-dependent frequency to the standard frequency as a function of the temperature, extending over the range of about $-10°$ to 50° C, in the case of the precited example.

If the temperature measurement lasts for 1 second, the error in the measurement of the thermometer frequency of $9.5\times10^{-6}$Hz is on the order of 1 to 2 Hz, which represents an error in temperature of $3\times10^{-3}$ ° C. Thus this thermometer can be very sensitive.

Figure 3B:
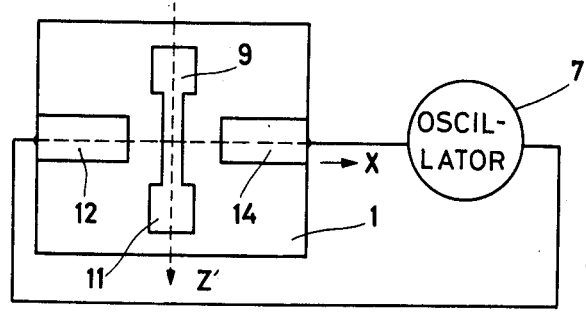

FIGS. 3A and 3B illustrate another embodiment of a quartz crystal plate 1 usable in the present quartz thermometer. The two modes of vibration are two thickness-shear modes Y'X of two different anharmonic frequencies. Quartz plate 1, of rectangular form is a conventional AT-cut plate and is metallized on its two major faces. Whereas the forms of the embodiments illustrated in FIGS. 1 and 2 left the active zone in the center of the plate 1 without metallization, the example described with reference to FIGS. 3A and 3B comprises on its first major face two floating electrodes 13, 15, electrically connected to each other and on its second major face two other floating electrodes 9, 11 also electrically connected to each other. Two separate electrodes 8 and 10 are arranged to respectively face the floating electrodes 11 and 9 on the opposite side of plate 1. In a similar manner, two separate electrodes 12 and 14 are arranged to face the floating electrodes 13 and 15, on the opposite side of plate 1.

A coupling arrangement referred to as "series coupling" is accomplished in the following manner. The electrodes 8 and 10 of the upper face are connected to the two terminals of oscillator circuit 6. The field $E_{Y'}$ induced by electrodes 8 and 11 is in phase opposition with the field $E_{Y'}$ induced by the electrodes 9 and 10. The mode used, called "TT" ("Thickness-Twist") mode, corresponds to the first odd harmonic of thickness-shear vibration according to Y', to the first odd harmonic according to X and to the first even harmonic according to Z'. It is excited by those two zones of electrical field and supplies the standard frequency in conjunction with the oscillator circuit 6.

The electrodes 12 and 14 of the lower face are connected to the two terminals of oscillator circuit 7. The field $E_{Y'}$ induced by the electrodes 12 and 13 is in phase opposition with the field $E_{Y'}$ induced by the electrodes 14 and 15. The mode used, called "TS" ("Thickness-Shear") mode, corresponds to the first odd harmonic of thickness-shear vibration according to Y', to the first even harmonic according to X and to the first odd harmonic according to Z'. It is excited by those two zones of electric field and supplies the thermometer or temperature-variable frequency in conjunction with oscillator circuit 7.

The "TT" and "TS" vibration modes are described for instance by W.D. Beaves in "The Journal of the Acoustical Soc. of America", Volume 43, No. 5 1968), page 972.

Figure 4A:
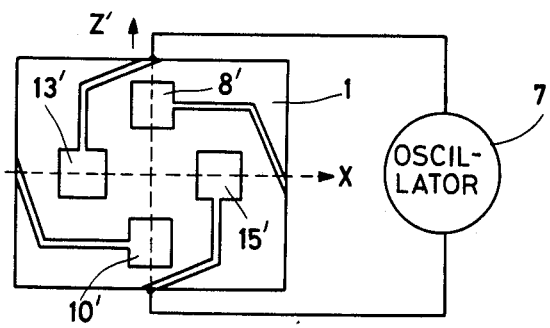
FIGS. 4A and 4B, respectively, are views from above and from underneath of another embodiment of a quartz crystal plate metallized on both of its large faces and used in a quartz thermometer in accordance with the invention.
Figure 4B:
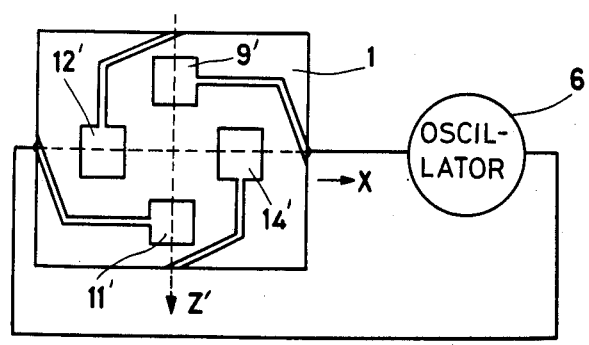

FIGS. 4A and 4B illustrate another embodiment of a quartz plate 1 metallized on its two major faces. The upper face comprises four electrodes 8', 13', 10' and 15' symmetrically arranged in relation to the central axis of the plate 1. The lower face also comprises four electrodes 9', 12', 11' and 14' arranged in a manner similar to that of the upper face, with 9' facing 10', 11' facing 8', 12' facing 13' and 14' facing 15'. A coupling arrangement referred to as "parallel coupling" is accomplished in the following manner.

The electrodes 8' and 9' are connected to one terminal of the oscillator circuit 6, while the electrodes 10' and 11' are connected to the other terminal of this oscillator circuit 6. The electrodes 12' and 15' are connected to one terminal of the oscillator circuit 7, while the electrodes 13' and 14' are connected to the other terminal of this oscillator circuit 7. The geometry of the electric fields is similar to the preceding example described in reference to FIGS. 3A and 3B. That is, the electrodes 8' and 11' on the one hand, and 9' and 10' on the other hand, excite the mode called "TT" mode, and the electrodes 12', 13' on the one hand and 14', 15' on the other hand excite the mode called "TS" mode.

The electrodes 8 to 11 of FIG. 3, or 8' to 11' of FIG. 4 induce a field in the zones of high stress for the mode called "TT" mode. This field is symmetric in relation to the axis X and symmetric in relation to the plane XZ'; it excites the mode called "TT" mode which has the same symmetries, but does not excite the mode called "TS" mode.

The electrodes 12 to 15 of FIG. 3, or 12' to 15' of FIG. 4 induce a field in the zones of high stress for the mode called "TS" mode. This field is symmetric in relation to the plane XY' and in relation to the axis Z'; thus it excites the mode called "TS" mode which has the same symmetries, and does not excite the mode called "TT" mode.

The two frequencies corresponding to the two modes are different and have different temperature coefficients. No mechanical coupling exists between the two said modes.

In a general manner, to make a quartz thermometer according to the invention it is sufficient to simultaneously excite two different modes of oscillation, which supply two different frequencies with different temperature coefficient properties, in the same volume of quartz. Towards that purpose, it is sufficient to, on the one hand, select a suitable block of quartz, and on the other hand, provide a suitable arrangement of the electrodes for permitting separate excitation of two different modes. As far as the choice of the quartz is concerned, as an example, bars oscillating in length extension and flexion, or contour or thickness mode plates can be used having a linear temperature coefficient of frequency near to zero. Moreover, it is known that each quartz block has a great number of vibrations, at different frequencies, each of which have different temperature coefficients.

Besides its use as a precision thermometer, one of the uses of a quartz thermometer according to the invention results from its capability of stabilizing the oscillation frequency of the quartz in a precision oscillator. The quartz is placed in a thermostat or temperature stable chamber. The frequency, which is the most stable with respect to temperature, is used as a reference frequency of the precision oscillator. The other frequency, which is highly dependent on the temperature, serves to measure this temperature and, with the help of a servo-mechanism, to stabilize the temperature of the thermostat or temperature stable chamber, and consequently of the quartz.

The present invention provides a precise quartz thermometer, of small bulk and low cost compared with known quartz thermometers. Because of the use of only one quartz element, many disturbing effects as well as aging influence the two modes in the same way, but not the frequency ratio, which results in a considerable improvement of the precision of the thermometer. Moreover, since the ratio of the frequencies is nearly independent of the thickness of the quartz plate, an adjustment operation of the quartz frequencies is not required if only the temperature has to be measured, which greatly reduces the cost of manufacture.

The cost of the thermometer is also decreased by the choice of coupling and the form of the electric field, which permits metallization on one face only of the quartz, and involves a notable simplification in the manufacturing process. The cost is also low thanks to the use of AT-or BT-cut quartz plates currently utilized in the industry.

I claim:

1. A quartz crystal thermometer comprising a single quartz element having at least a first and a second pair of electrodes and vibrating simultaneously in two different modes which are not mechanically coupled with each other and which correspond to two different frequencies of vibration, each of said first and second pairs of electrodes being arranged for providing high piezoelectric coupling with one corresponding mode of the said two modes of vibration and for providing no piezoelectric coupling with the other mode, one of the said two frequencies of vibration being a standard frequency and the other being dependent on the temperature of the quartz crystal, the thermometer further comprising a first and a second oscillator circuit respectively connected to the said first and second pairs of electrodes, and a frequency comparison device for comparing the oscillation frequencies of the first and second oscillator circuits and providing an output which is a measure of the detected temperature.

2. A quartz crystal thermometer in accordance with claim 1 wherein said quartz element is a quartz crystal plate with main axes X, Y' and Z'.

3. A quartz crystal thermometer in accordance with claim 2 wherein the electrodes of the first pair of electrodes are spaced in the direction of the Z'-axis and connected to the oscillator circuit providing the standard frequency, and the electrodes of the second pair of electrodes are spaced in the direction of the X-axis and connected to the oscillator circuit providing the temperature-dependent frequency.

4. A quartz crystal thermometer in accordance with claim 3 wherein said quartz crystal plate has metallized electrodes formed on only one of its major faces and arranged along the edges of said plate, leaving a non-metallized active zone in the center of said plate.

5. A quartz crystal thermometer in accordance with claim 3 wherein said quartz crystal plate has metallized electrodes formed on both of its major faces, said metallized electrodes being arranged along the edges of said plate leaving a non-metallized active zone in the center of said plate, each electrode comprising a metallized part formed on one of the major faces of said quartz element and a metallized part formed on the opposite major face of said quartz element with the two metallized parts of each electrode facing each other and being electrically connected to one another.

6. A quartz crystal thermometer in accordance with claim 2 wherein said quartz crystal plate has metallized electrodes formed on both of its large faces, said metallized electrodes being arranged and electricaly connected to excite simultaneously a thickness-twist mode Y'X and a thickness-shear mode Y'X, both modes having different anharmonic frequencies.

7. A quartz crystal thermometer in accordance with claim 6, wherein the said electrodes comprise a first pair of electrodes formed on one of the major faces of the crystal plate, spaced in the direction of the Z'-axis and connected to the oscillator circuit providing the standard frequency, a second pair of electrodes formed on the other one of the major faces of the crystal plate, spaced in the direction of the X-axis and connected to the oscillator circuit providing the temperature-dependent frequency, and four floating electrodes, two of which are formed on each major face of the crystal plate, the two floating electrodes of each major face being electrically connected to one another and each floating electrode being placed in facing relationship with a corresponding electrode of the said first and second pairs of electrodes, formed on the opposite major face of the crystal plate.

8. A quartz crystal thermometer in accordance with claim 6, the said electrodes comprising a first pair of electrodes formed on one major face of the crystal plate, spaced in the direction of the Z'-axis and connected to the oscillator circuit providing the standard frequency, a second pair of electrodes formed on the other one of the major faces of the crystal plate, spaced in the direction of the X-axis and connected to the oscillator circuit providing the temperature-dependent frequency, a third pair of electrodes formed on the same face of the crystal plate as the said first pair, each electrode of the third pair facing a corresponding electrode of the said second pair of electrodes in the direction of the Y'-axis and being electrically connected to the other electrodes of the said second pair, and a fourth pair of electrodes formed on the same face of the crystal plate as the said second pair of electrodes, each electrode of the fourth pair facing a corresponding electrode of the said first pair of electrodes in the direction of the Y'-axis and being electrically connected to the other electrode of said first pair of electrodes.

* * * * *